(12) United States Patent
Kong et al.

(10) Patent No.: US 7,571,808 B2
(45) Date of Patent: Aug. 11, 2009

(54) PACKING MATERIALS FOR MODULE OF DISPLAY APPARATUS

(75) Inventors: Junhee Kong, Gyeongsangbuk-do (KR); Deoksoo Kim, Gyeongsangbuk-do (KR); Kwaneun Jin, Gyeongsangbuk-do (KR)

(73) Assignee: LG Electronics Inc., Seoul (KR)

( * ) Notice: Subject to any disclaimer, the term of this patent is extended or adjusted under 35 U.S.C. 154(b) by 221 days.

(21) Appl. No.: 11/427,122

(22) Filed: Aug. 11, 2006

(65) Prior Publication Data

US 2007/0205117 A1    Sep. 6, 2007

(30) Foreign Application Priority Data

Feb. 27, 2006    (KR) .................... 10-2006-0019011

(51) Int. Cl.
*B65D 85/38* (2006.01)
(52) U.S. Cl. .................... 206/454; 206/523; 206/592
(58) Field of Classification Search ................ 206/454, 206/523, 346.01, 455, 453, 600, 325, 724, 206/722, 486, 562, 503, 509, 510, 511, 512, 206/328, 329, 508, 592, 763; 324/158; 29/760; 439/526
See application file for complete search history.

(56) References Cited

U.S. PATENT DOCUMENTS

| | | | | |
|---|---|---|---|---|
| 4,513,353 A | * | 4/1985 | Bakermans et al. | 361/759 |
| 4,618,069 A | * | 10/1986 | Quong | 220/23.4 |
| 4,620,632 A | * | 11/1986 | Alemanni | 206/724 |
| 4,767,984 A | * | 8/1988 | Bakker | 324/754 |
| 5,020,674 A | * | 6/1991 | Thorud et al. | 206/600 |
| 5,161,692 A | * | 11/1992 | Knierim | 206/586 |
| 5,522,539 A | * | 6/1996 | Bazany | 229/199 |
| 7,066,342 B2 | * | 6/2006 | Baechle et al. | 211/191 |
| 7,320,403 B2 | * | 1/2008 | May, Jr. | 206/320 |
| 2005/0269229 A1 | * | 12/2005 | Lowry | 206/386 |

FOREIGN PATENT DOCUMENTS

KR    10-0378076    3/2003
WO    WO 2004/050511    6/2005

* cited by examiner

*Primary Examiner*—Bryon P Gehman
*Assistant Examiner*—Ernesto A Grano
(74) *Attorney, Agent, or Firm*—Fish & Richardson P.C.

(57) ABSTRACT

The packing materials for the module of the display apparatus comprise a plane frame having an opening in its center, a side frame formed to be connected to the plane frame in the direction approximately perpendicular to the circumference of the plane frame, a combination unit formed on the rear surface of the plane frame and a guiding unit mounted at the corner of the side frame and combined with the combination unit.

18 Claims, 8 Drawing Sheets

PACKING MATERIALS FOR MODULE OF DISPLAY APPARATUS

This Nonprovisional application claims priority under 35 U.S.C. § 119(a) on Patent Application No. 10-2006-0019011 filed in Korea on Feb. 27, 2006, the entire contents of which are hereby incorporated by reference.

BACKGROUND OF THE INVENTION

1. Field of the Invention

The present invention relates to packing materials for a module of a display apparatus which may protect the module.

2. Description of the Background Art

In general, a display apparatus comprises LCDs (liquid crystal displays), FEDs (Field Emission Displays), OELDs (Organic Electro Luminescence Displays), plasma display apparatuses and the like.

A display apparatus typically comprises a panel for displaying images and a driver integrated with a driving circuit for implementing images. In addition, the display apparatus further comprises a power supply and various auxiliary devices for driving the driver. As such, the driver, power supply, and auxiliary device are assembled onto a substrate which may be electrically connected thereto, and combined with the panel which displays images, thus completing one module.

As the display apparatus is large-sized, the size and weight of the module is also increased. Thus, there exists a problem that while the module of display apparatus is carried by packing materials for the module, it can be broken by frequent vibrations and impacts.

Moreover, there may occur a problem that in a case where the packing materials for the module of the display apparatus are carried by vehicles or stored in warehouses, this may increase costs relating to logistics since the packing materials for module can not be loaded.

SUMMARY OF THE INVENTION

Packing materials for a module of a display apparatus according to the present invention comprises a plane frame having an opening in its center, a side frame formed to be connected to the plane frame in the direction approximately perpendicular to the circumference of the plane frame, a combination unit formed on the rear surface of the plane frame, and a guiding unit inserted in the combination unit and fixing the plane frame formed on one and more of edges of the plane frame.

In addition, an assembly structure according to the present invention comprises packing materials for a module of a display apparatus, and the module for the display apparatus arranged between the packing materials for the module.

BRIEF DESCRIPTION OF THE DRAWINGS

The embodiment of the invention will be described in detail with reference to the following drawings in which like numerals refer to like elements.

DETAILED DESCRIPTION OF PREFERRED EMBODIMENTS

Figure 1A:
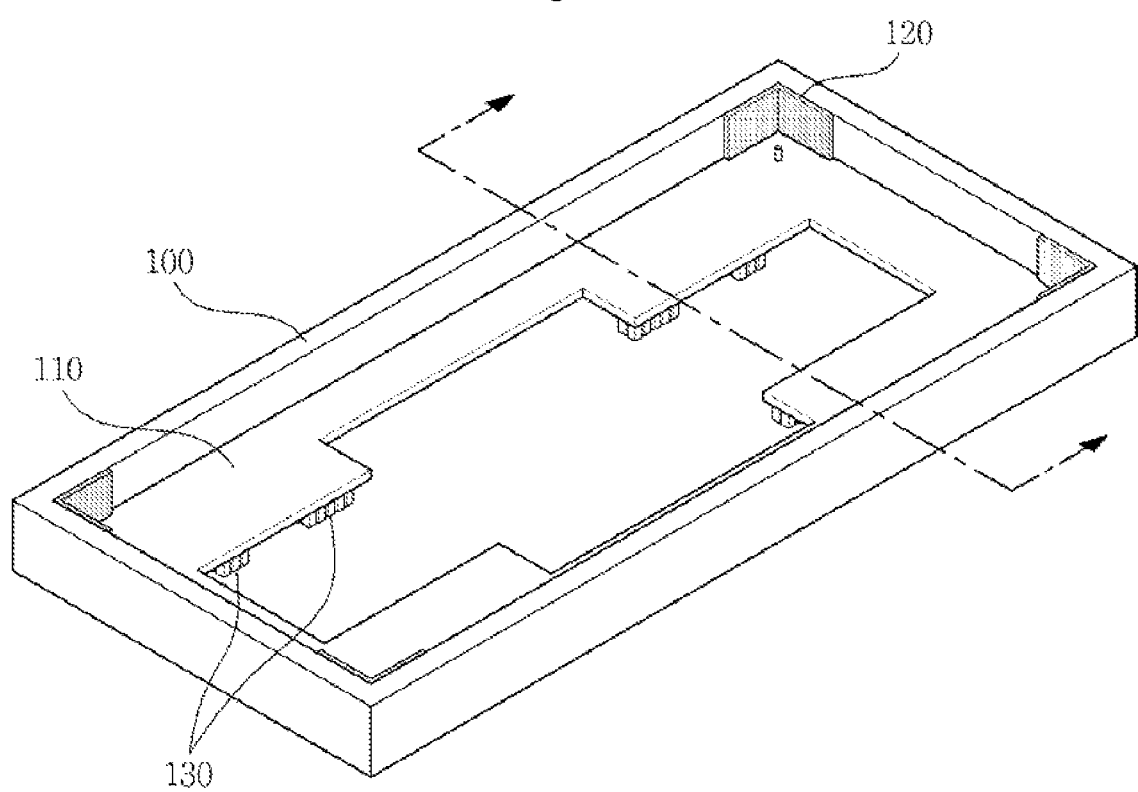
FIGS. 1a and 1b are views of illustrating a structure of packing materials for a module of a display apparatus according to an embodiment of the present invention.

Embodiments of the present invention will be described in a more detailed manner with reference to the drawings.

Packing materials for a module of a display apparatus according to the present invention comprises a plane frame having an opening in its center, a side frame formed to be connected to the plane frame in the direction approximately perpendicular to the circumference of the plane frame, a combination unit formed on the rear surface of the plane frame, and a guiding unit inserted in the combination unit.

Here, the plane frame and the side frame are integrally formed with each other.

In addition, the plane frame and the side frame are made of a thermoplastic-based material.

In addition, the thermoplastic-based material is any one of an expandable polystyrene, an expandable polypropylene, and an expandable polyethylene.

The guiding unit is formed on one and more of edges on the plane frame and fixes the plane frame.

In addition, the guiding unit has a form to correspond to the plane frame.

In addition, the combination unit has a groove form.

In addition, one and more protrusions are formed on the plane frame inside the guiding unit.

In addition, a support means is combined to the protrusion to suppress a horizontal movement of the module.

In addition, the support means and guiding unit are made of any one of plastics, metals, and nonferrous metals.

In addition, the support means is integrally formed with the guiding unit.

In addition, the support means has a plurality of holes, any one of the holes being inserted in the protrusion.

In addition, the module comprises a first fixing means, and the first fixing means combined to other holes formed on the support means.

In addition, the packing materials for the module of the display apparatus further comprises at least one and more damping units on the rear surface of the plane frame.

In addition, in a case where the module comprises a second fixing means, the damping units are placed on the second fixing means.

In addition, an assembly structure comprises packing materials for a module of a display apparatus comprising a plane frame having an opening in its center, a side frame formed to be connected to the plane frame in the direction approximately perpendicular to the circumference of the plane frame, a combination unit formed on the rear surface of the plane frame, and a guiding unit fixing the plane frame inserted in the combination unit and formed on one and more of edges of the plane frame, and a module for a display apparatus arranged between the packing materials for the module.

Here, the plane frame and the side frame are made of a thermoplastic-based material.

In addition, the assembly structure further comprises a paper angle unit for protecting the plane frame and the side frame.

In addition, the paper angle unit is formed on a side surface or edge outside the plane frame and side frame.

In addition, the paper angle unit and guiding unit are made of any one of plastics, metals, and nonferrous metals.

Hereinafter, a structure of packing materials for a module of a display apparatus of the present invention and assembly structure will be described in more detailed manner with reference to the accompanying drawings.

Figure 1B:
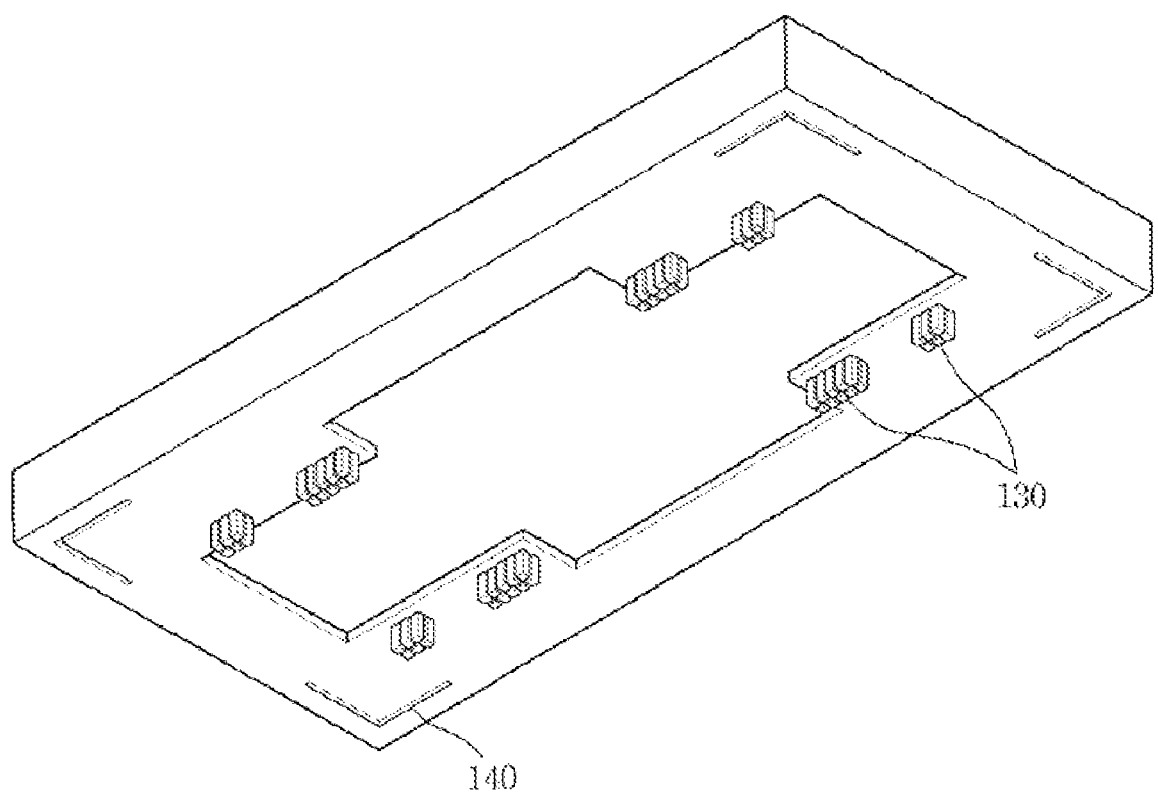

FIGS. 1a and 1b are views of illustrating a structure of packing materials for a module of a display apparatus according to an embodiment of the present invention.

Referring to FIGS. 1a and 1b, packing materials for a module of a display device according to the present invention comprises a plane frame 110, a side frame 100, a guiding unit 120, and a combination unit 140 and damping unit 150 formed on the rear surface of the plane frame 110.

The plane frame 110 is formed to have an opening in its center so that the module (not shown) of the display apparatus may be placed stably without any swaying. This opening lets a glass formed on the front surface of the module put therein, and thus prevents the glass from being broken during the transportation.

The side frame 100 is connected in the nearly vertical direction along the surrounding of the plane frame 110, and protects the module (not shown). At this time, when the side frame 100 is connected to the plane frame 110, the side frame 100 is desirably formed to be perpendicular to the plane frame 110, but may also be formed to make an acute angle or obtuse angle with the plane frame 110.

The plane frame 110 and side frame 100 are integrally formed with each other, and made of light and damage-resistant thermoplastics based materials. At this time, the thermoplastics may comprise any one of an Expandable Polystyrene, an Expandable Polypropylene, and an Expandable Polyethylene. In particular, the Expandable Polystyrene is further stable from the contact with the module since it has resilience.

Accordingly, the plane frame 110 and side frame 100 absorb the possible vibrations and impacts transferred to the module (not shown), place and support the module stably. Most of all, the plane frame 110 and side frame 100 may prevent the vertical directional movement of the module.

The guiding unit 120 has a form to correspond to the edge of the plane frame 110. For example, the guiding unit 120 has a form of "L" since the plane frame 110 is rectangular, and it is formed to be attached to the edge of the side frame 100.

The combination unit 140 is formed on the rear surface of the plane frame 110 while corresponding to the guiding unit 120 formed on the front surface of the plane frame 110. This combination unit 140 takes a form of a groove and allows the guiding unit 120 to be inserted therein. In other words, the guiding unit 120 is inserted in the groove of the combination unit 140 formed on the rear surface of the plane frame 110, and formed on the front surface of the plane frame 110.

As such, the guiding unit 120 is inserted and combined in the combination unit 140 formed on the rear surface of the plane frame 110, and this may have the plane frames 110 formed layer by layer. Therefore, the guiding unit 120 may fix and align the plane frames 110.

The damping unit 150 is formed on the rear surface of the plane frame 110 and suppresses the upper and lower movements of the module formed on the rear surface of the plane frame 110 when the plane frame 110 is formed layer by layer and the module of the display apparatus (not shown) is arranged between plain frames 200.

Here, the damping unit 150, which is formed on the rear surface of the plain frame 110, is formed by other structures formed on the module of the display apparatus, and its detailed description will be described later with reference to FIG. 3.

On the other hand, a protrusion and a support means are further comprised on the plain frame 110 shown in FIG. 1a, which will now be described.

Figure 2A:
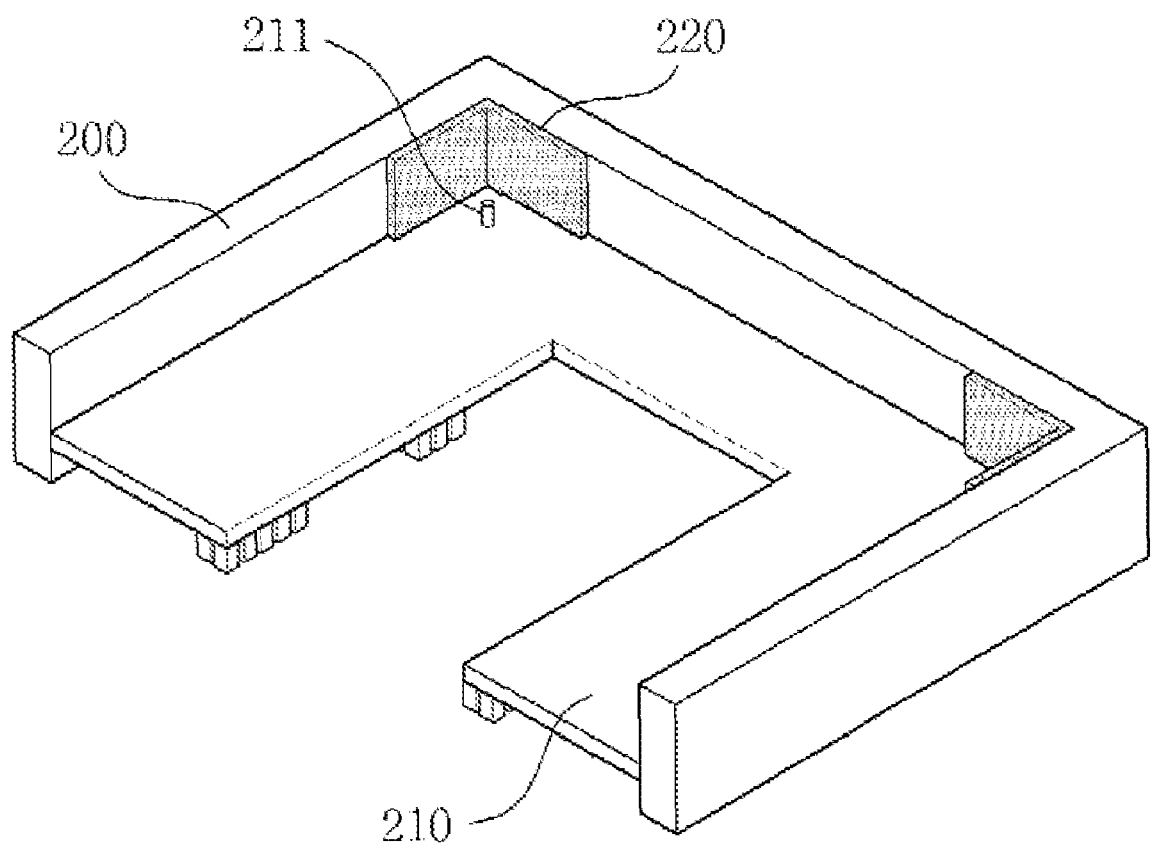
FIGS. 2a to 2c are views for illustrating a protrusion and a support means formed on a plane frame according to an embodiment of the present invention.
Figure 2B:
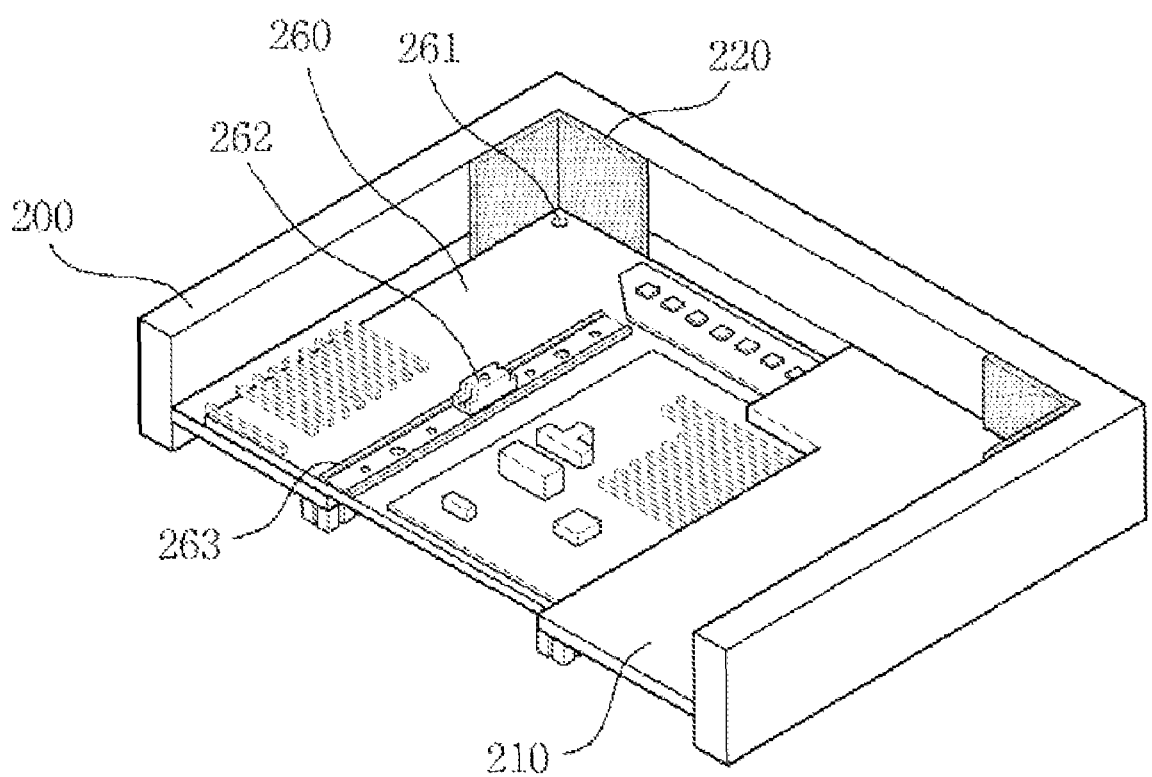
Figure 2C:
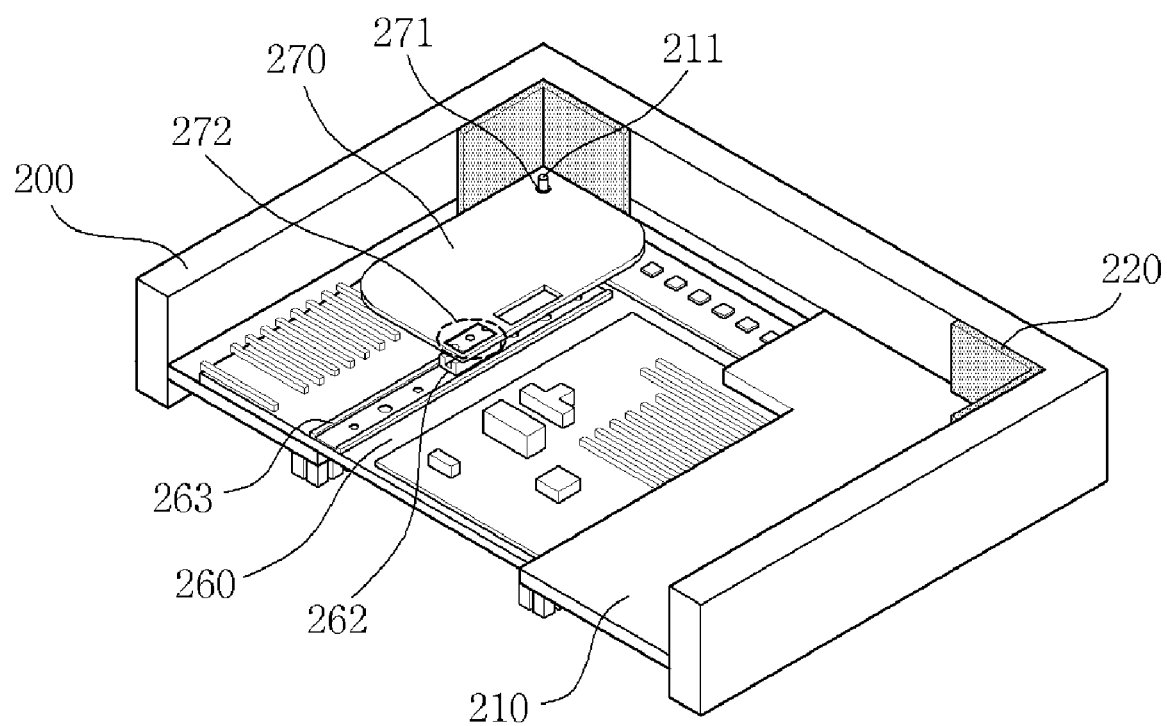

FIGS. 2a to 2c are views for illustrating a protrusion and a support means formed on a plane frame according to an embodiment of the present invention.

First, referring to FIG. 2a, a protrusion 211 and a support means 270 are further comprised on the plain frame 210 of the present invention.

The protrusion 211 is formed on the plain frame 210 and inside the guiding unit 220 in plurality, and a hole of the module is inserted in the protrusion. That is, as shown in FIG. 2b, when the module 260 is placed on the plane frame 210, the hole 261 formed around the edge of the module 260 is inserted in the protrusion 211. Then, as shown in FIG. 2c, another guiding unit 220 and support means 270 are formed on the upper side of the module 260 of the display apparatus.

The support means 270 serves to support the other plain frame and side frame to be formed on the upper side thereof, and has a plurality of holes 271, 272 to fix the plain frame 210 and module 260 formed on the rear surface of the support means 270.

Thus, considering FIGS. 2a to 2c collectively, the protrusion 211 formed on the plane frame 210 is first inserted in the hole 261 formed around the edge of the module 260, and then inserted in either of the plurality of holes 271, 272 formed on the support means 270. As such, since the protrusion 211 formed on the plane frame 210 is holes 261, 271 of the module 260 and support means 270, and thus the plane frame 210, module 260, and the support means 270 are fixed to one another, the horizontal directional movement of the module 260 can be suppressed.

Meanwhile, as shown in FIG. 2c, the other hole 272 of the plurality of holes 271, 272 of the support means 270 is combined to the first fixing means 262, 263 of the module 260. At this time, the first fixing means 262, 263 comprises a supporter 263 and a supporter bracket 262. The supporter 262 serves to fix the support bracket 262, and the support bracket 262 is combined with one 272 of the plurality of holes 271, 272 of the support means 270 and suppresses the horizontal directional movement of the module 260.

Moreover, even when the support bracket 262 of the module 260 and hole 272 of the support means 270 are combined to each other and thus another plane frame (not shown) is arranged on the upper side of the support means 270, the support means 270 may protect the module 260.

Here, it is desirable that the support means 270 is integrally formed with the guiding unit 220. The reason is as follows. That is, since the guiding unit 220 may fix the plane frames 210 to form the plane frames 210 in plurality, and the support means 270 may suppress the horizontal directional movement of the module 260, integrally forming the guiding unit 220 and support means 270 enables the structure of the packing materials for the module of the display apparatus according to the present invention to become harder and faster.

As a result, the packing materials for the module of the display apparatus according to the present invention allows for preventing the damage to the module and facilitating the loading of the module during transportation and storing in warehouses. The function of the support means 270, guiding unit 220, and protrusion 211 formed on the plane frame 200 has been described herein with reference to FIGS. 2a to 2c.

On the other hand, a damping unit 130 is formed on the rear surface of the aforementioned plane frame 110, whose function will now be described with reference to FIG. 3.

Figure 3:
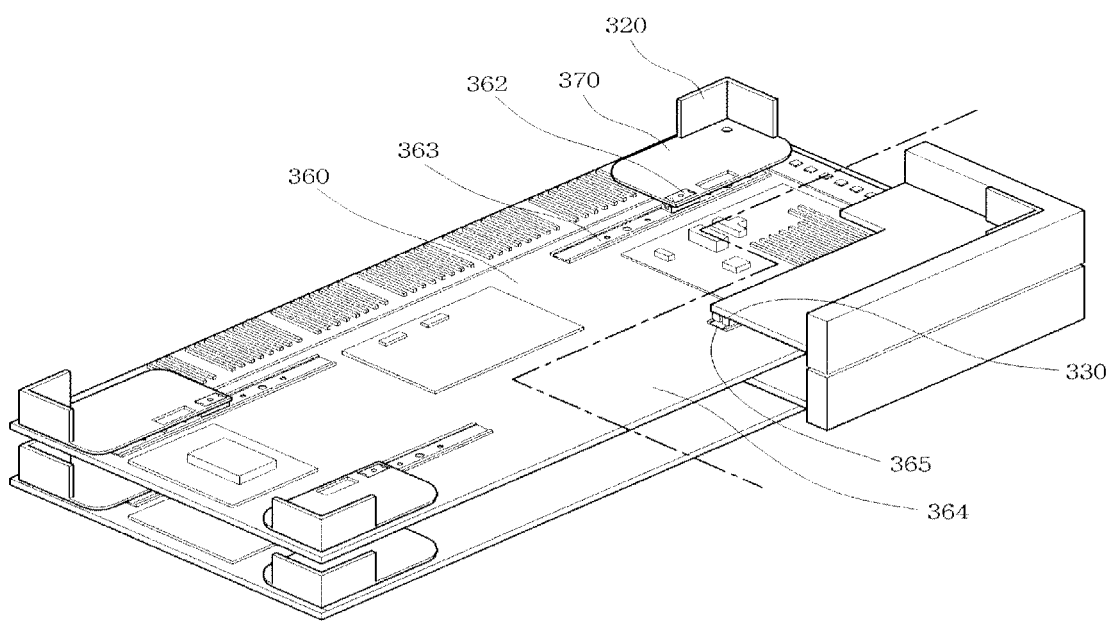
FIG. 3 is a view of illustrating a support means a guiding unit formed on the plane frame 310 and a damping unit formed on the rear surface of the plane frame according to an embodiment of the present invention.

FIG. 3 is a view of illustrating a support means and a guiding unit formed on the plane frame and a damping unit formed on the rear surface of the plane frame according to an embodiment of the present invention.

FIG. 3 compares a support means and guiding unit 320 on the plane frame 310 and the damping unit 330 on the rear surface of the plane frame 310.

Referring to FIG. 3, a left side of a solid line shows a structure of a module 360 formed on the plane frame (not shown), and the support means 370 and guiding unit 320 formed on the upper side of the module 360, and a right side shows a structure of a damping unit 330 and module 364 formed on the rear surface of the plane frame 310. The overall structure shows that on the plane frame (not shown) is formed the module 360, and on the upper side of the module 360 are formed the support means 370 and guiding unit 320, on the upper side of which is in turn formed another plane frame 310, on the rear surface of which is formed the damping unit 330.

The description on the function of the support means 370 and guiding unit 320 formed on the plane frame (not shown) shown in the left side of the solid line will be omitted since it has been described in detail with reference to FIG. 2c. Here, when the modules are stacked in plurality, the support means 370 should be made of a material capable of supporting load of other modules to be formed on the upper-side thereof.

In addition, the guiding unit 320 should be made of a material not to be bent or broken when it is combined to the combination unit (not shown) formed on the rear surface of the other plane frame (not shown) to be formed on the upper side of the support means 370. Therefore, it is desirable that material for the support means 370 and guiding unit 320 comprises any one of plastics, metals, and nonferrous metals to be capable of supporting load of the modules as well as hardening the combination between the plane frames.

On the other hand, on the rear surface of the plane frame 310 shown in the right side of the solid line there is formed the damping unit 330 which is placed in a second fixing means 363 of the module 364 formed on the rear surface of the plane frame 310. At this time, the second fixing means 365 is desirably a supporter.

The supporter serves to make the damping unit 330 placed and fixed. Therefore, since the damping unit 330 is fixed to the supporter, a second fixing means 365, it may prevent the upper and lower directional movements of the module 364.

As such, the packing materials for the module of the display apparatus according to the present invention may suppress the horizontal directional movement of the module 360 by the support means 370 and the vertical directional movement of the module 364 by the damping unit 330, thus improving the stability of the modules 360, 364.

On the other hand, the plane frames and the side frames connected to the plane frames are formed layer by layer, modules are arranged between the frames, this constitutes one assembly set structure.

Figure 4:
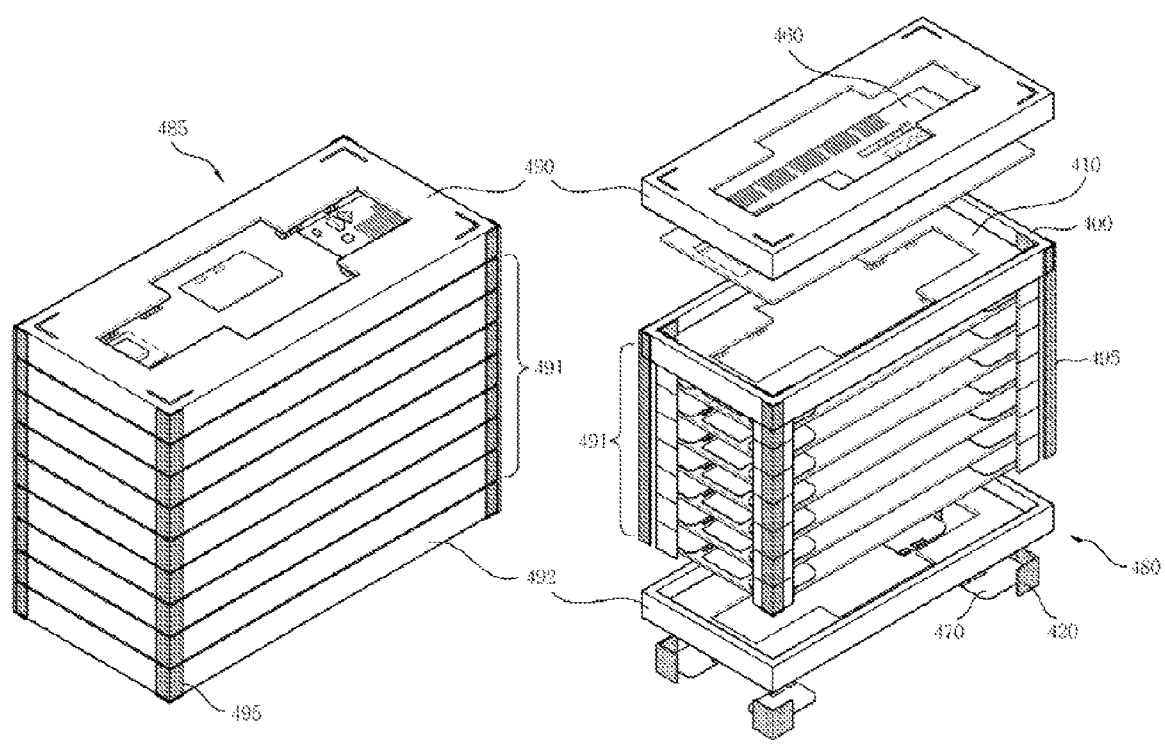
FIG. 4 is a view of illustrating an assembly structure according to an embodiment of the present invention.

FIG. 4 is a view of illustrating an assembly structure according to an embodiment of the present invention.

Referring to FIG. 4, the assembly structure 485 according to the present invention comprises packing materials 480 for the module of the display apparatus and the module 460 for the display apparatus arranged between the packing materials 480.

At this time, the packing materials 480 for the module of the display apparatus comprise a plane frame 410, a side frame 400, a combination unit (not shown), a guiding unit 420, and a support means 470.

On the plane frame 410 is placed a module 460 for a display apparatus. The side frame 400 is connected to the plane frame in the nearly vertical direction. At this time, the nearly vertical direction may form an acute angle or obtuse angle.

The guiding unit 420 is inserted in a groove of the combination unit (not shown) formed in the rear surface of the plane frame 410, formed in one and more of edges on the plane frame 410, and fix the plane frame 410. The guiding unit 420 is made of any one of plastics, metals, and nonferrous metals.

The support means 470 is integrally formed with the guiding unit 420, so that when the guiding unit 420 is inserted in the combination unit of the plane frame 410 placed on the upper side of the guiding unit 420, the support means 470 may mitigate the movement of the module 460 for the display apparatus placed between the plane frames 410 located on the upper and lower sides and the module 460 for display apparatus placed between the plane frames 410.

As such, the packing materials 480 for the module of the display apparatus comprising the above mentioned constitutional elements constitute one assembly 485 comprising modules formed in plurality between the packing materials for the module.

Here, the assembly 485 according to the present invention comprises packing materials 490 for upper module, packing materials 491 for middle module, and packing materials 492 for lower module.

The packing materials 490 for upper module have a structure in which only the plane frame 410 is formed. The packing materials 491 for middle module have a structure in which a plurality of plane frames 410 and side frames 400 are formed. The packing materials 492 for lower module have a structure in which the plane frame 410 and side frames 400 are formed. Here, the respective packing materials 490, 491, 492 for module, whose name is defined by their location, comprise a guiding unit, a combination unit, and a support means, whose description has already described above and theirs detailed description will be omitted.

As such, the packing materials 490 for upper module comprise only the plane frame 410 since no module 460 is formed on the packing materials 490. However, the packing materials 491, 492 for middle module and lower module comprise the side frame 400 as well as plane frame 410 since modules 460 are formed on the packing materials 491, 492. In the assembly 485 having the aforementioned structure, the plane frame 410 and side frame 400 are desirably made of thermoplastic materials.

That is, it is desirable that the plane frame 410 and side frame 400 are made of materials such as expandable polystyrene, expandable polypropylene, expandable polyethylene, etc. These materials are light and hard in such an extent to be capable of enduring the load of the module 460 whose volume and size are increased as the display apparatus becomes large sized. However, the plane frame 410 and side frame 400 may be made of other materials such as nonferrous metals, wood, metals, etc.

Therefore, the assembly structure according to the present invention may protect the plurality of modules safely without any damage. In addition, the assembly structure according to the present may save the costs relating to logistics since its loading is facilitated during its transportation and storing in warehouses.

Meanwhile, the assembly of the present invention further comprises a paper angle unit 495.

The paper angle unit 495 is formed in plurality on the side surfaces or edges outside the plane frame 410 and side frame 400 when the packing materials 480 for module are formed in plurality and layer by layer. This paper angle unit 495 is made of any one of plastics, metals, and nonferrous metals, and thus absorbs the load of the frames 410, 410 and modules 460 and transfer the load to a palette (not shown) placed on the floor.

In addition, the paper angle unit 495 may prevent the movement between frames and fix the frames, and this allows for providing more stability of the module. Moreover, it may protect the module from the impacts from the outside during transportation.

On the other hand, effects from the above mentioned packing materials for the module of the display apparatus and assembly structure constituting the packing materials will be described below with reference to FIG. 5.

Figure 5:
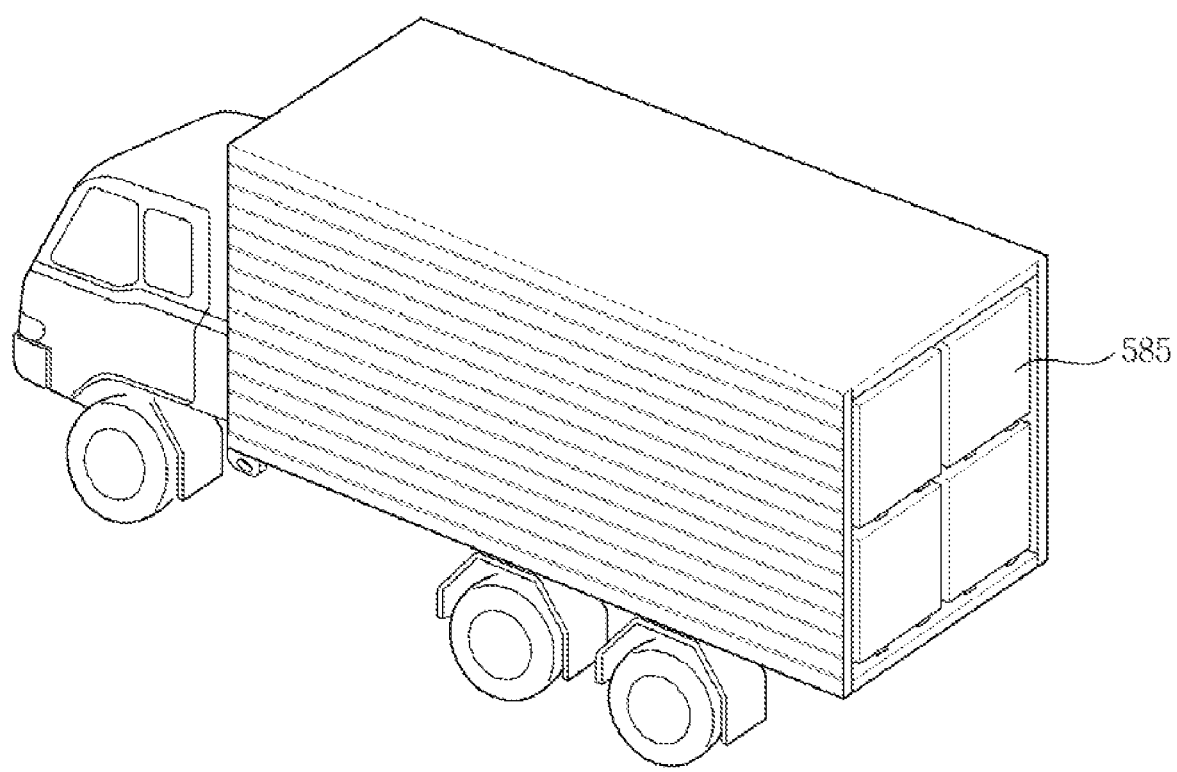
FIG. 5 is a view for illustrating an effect from the assembly structure described according to an embodiment of the present invention.

FIG. 5 is a view for illustrating an effect from the assembly structure described according to an embodiment of the present invention.

As shown in FIG. 5, in the assembly structure of the present invention, one assembly 585 is comprised of a plurality of packing materials for the module to be loaded. That is, the assemblies 585 comprising in two columns and two rows the packing materials for the module of the display apparatus are easily loaded in the interior of vehicles, and thus this may save the costs relating to transportation.

In addition, more assemblies 585 may be loaded when the assemblies 585 comprising the packing materials for the module of the display apparatus are stored in warehouses, and thus this may save the costs relating to logistics.

The embodiment of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. Packing materials for a module of a display apparatus comprising:
    a plane frame having an opening in its center;
    a side frame formed to be connected to the plane frame in the direction approximately perpendicular to the circumference of the plane frame;
    a combination unit formed on the rear surface of the plane frame;
    a guiding unit mounted at the corner of the side frame, and combined with the combination unit;
    protrusions formed on the plane frame inside the guiding unit; and
    a support unit combined to the protrusions to suppress a horizontal movement of the module and integrally formed with the guiding unit.

2. The packing materials for the module of the display apparatus of claim 1, wherein the plane frame and the side frame are integrally formed with each other.

3. The packing materials for the module of the display apparatus of claim 2, wherein the plane frame and the side frame are made of a thermoplastic-based material.

4. The packing materials for the module of the display apparatus of claim 3, wherein the thermoplastic-based material is any one of an expandable polystyrene, an expandable polypropylene, and an expandable polyethylene.

5. The packing materials for the module of the display apparatus of claim 1, wherein the guiding unit is formed on one and more of edges on the plane frame and fixes the plane frame.

6. The packing materials for the module of the display apparatus of claim 1, wherein the guiding unit has a form to correspond to the edge of the plane frame.

7. The packing materials for the module of the display apparatus of claim 1, wherein the combination unit has a groove form.

8. The packing materials for the module of the display apparatus of claim 1, wherein the support unit and guiding unit are made of any one of plastics and metals.

9. The packing materials for the module of the display apparatus of claim 1, wherein the support unit has a plurality of holes, any one of the holes being inserted in the protrusion.

10. The packing materials for the module of the display apparatus of claim 1, wherein the module comprises a first fixing unit, the fixing unit combined to other holes formed on the support unit.

11. The packing materials for the module of the display apparatus of claim 1 further comprising damping units on the rear surface of the plane frame.

12. The packing materials for the module of the display apparatus of claim 11, wherein the module comprises a second fixing unit, and the damping units are placed on the second fixing unit.

13. The packing materials for the module of the display apparatus of claim 1, wherein the support means unit and guiding unit are made of nonferrous metals.

14. An assembly structure comprising:
    packing materials for a module of a display apparatus comprising a plane frame having an opening in its center, a side frame formed to be connected to the plane frame in the direction approximately perpendicular to the circumference of the plane frame, a combination unit formed on the rear surface of the plane frame, a guiding unit fixing the plane frame combined with the combination unit and formed on the corner of the side frame, protrusions formed on the plane frame inside the guiding unit, and a support unit combined to the protrusions to suppress a horizontal movement of the module and integrally formed with the guiding unit; and
    a module for a display apparatus arranged between the packing materials for the module.

15. The assembly structure of claim 14, wherein the plane frame and the side frame are made of a thermoplastic-based material.

16. The assembly structure of claim 14 further comprising:
    a paper angle unit for protecting the plane frame and the side frame.

17. The assembly structure of claim 16, wherein
    the paper angle unit is formed on the side surface or the corner of the plane frame and the side frame.

18. The assembly structure of claim 16, wherein the paper angle unit and guiding unit are made of any one of plastics, metals, and nonferrous metals.

* * * * *